US010262752B2

(12) United States Patent
Traskov

(10) Patent No.: US 10,262,752 B2
(45) Date of Patent: Apr. 16, 2019

(54) METHOD AND APPARATUS FOR IDENTIFYING ERRONEOUS DATA IN AT LEAST ONE MEMORY ELEMENT

(71) Applicant: Continental Teves AG & Co. oHG, Frankfurt (DE)

(72) Inventor: Adrian Traskov, Steinbach (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 51 days.

(21) Appl. No.: 15/103,401

(22) PCT Filed: Dec. 16, 2014

(86) PCT No.: PCT/EP2014/078088
§ 371 (c)(1),
(2) Date: Jun. 10, 2016

(87) PCT Pub. No.: WO2015/091570
PCT Pub. Date: Jun. 25, 2015

(65) Prior Publication Data
US 2016/0314853 A1  Oct. 27, 2016

(30) Foreign Application Priority Data
Dec. 18, 2013 (DE) .......................... 10 2013 226 407

(51) Int. Cl.
*G11C 29/52* (2006.01)
*G11C 11/412* (2006.01)
(Continued)

(52) U.S. Cl.
CPC .............. *G11C 29/52* (2013.01); *G06F 11/10* (2013.01); *G11C 11/4125* (2013.01)

(58) Field of Classification Search
CPC ...... G06F 11/10; G11C 11/4125; G11C 29/52
See application file for complete search history.

(56) References Cited

U.S. PATENT DOCUMENTS 6,378,979 B1 * 4/2002 Anderson .............. B41J 2/0451
347/19
6,434,717 B1 * 8/2002 Fujii ..................... H03M 13/09
375/262

(Continued)

FOREIGN PATENT DOCUMENTS

CN  102651240 A  8/2012
CN  103187104 A  7/2013
(Continued)

OTHER PUBLICATIONS

German Search Report for German Application No. 10 2013 226 407.0 dated Jul. 11, 2014, including partial translation.

(Continued)

*Primary Examiner* — Guy J Lamarre
(74) *Attorney, Agent, or Firm* — RatnerPrestia

(57) ABSTRACT

A method for identifying erroneous data in at least one memory element, particularly a register, that includes at least one flip-flop that is intended to allow reliable detection of soft errors. To this end, writing of data to the at least one memory element involves at least one write security bit being produced from these data and stored in an associated security memory element, wherein at least one output security bit is computed from the data continuously in the same way as for writing and is compared with the corresponding write security bit.

8 Claims, 2 Drawing Sheets

(51) Int. Cl.
*G06F 11/10* (2006.01)
*H03M 13/00* (2006.01)

(56) References Cited

U.S. PATENT DOCUMENTS

| | | | |
|---|---|---|---|
| 7,482,831 B2 | 1/2009 | Chakraborty | |
| 2003/0110349 A1 | 6/2003 | Zimmerman | |
| 2003/0172328 A1* | 9/2003 | Wyatt | G06F 11/0727 714/704 |
| 2004/0193992 A1* | 9/2004 | Jamil | G06F 11/1064 714/742 |
| 2008/0080658 A1* | 4/2008 | Huang | H03L 7/095 375/376 |
| 2012/0221919 A1 | 8/2012 | Ekas et al. | |
| 2012/0240006 A1* | 9/2012 | Hu | H03M 13/253 714/756 |
| 2012/0297268 A1* | 11/2012 | Ishihara | G06F 11/1048 714/758 |
| 2013/0343133 A1* | 12/2013 | Sharma | G11C 29/32 365/189.05 |
| 2014/0022856 A1* | 1/2014 | Jung | G11C 7/1006 365/189.12 |
| 2016/0124803 A1 | 5/2016 | Minzoni | |

FOREIGN PATENT DOCUMENTS

| | | |
|---|---|---|
| DE | 102006019908 | 10/2007 |
| EP | 1482514 | 12/2004 |
| WO | 2005041410 | 5/2005 |

OTHER PUBLICATIONS

International Search Report and Written Opinion of the International Searching Authority for International Application No. PCT/EP2014/078088 dated Apr. 1, 2015.

Chinese Office Action for Chinese Application No. 201480068859.4, dated Apr. 3, 2018, 6 pages.

\* cited by examiner

METHOD AND APPARATUS FOR IDENTIFYING ERRONEOUS DATA IN AT LEAST ONE MEMORY ELEMENT

CROSS REFERENCE TO RELATED APPLICATIONS

This application is the U.S. National Phase Application of PCT International Application No. PCT/EP2014/078088, filed Dec. 16, 2014, which claims priority to German Patent Application No. 10 2013 226 407.0, filed Dec. 18, 2013, the contents of such applications being incorporated by reference herein.

FIELD OF THE INVENTION

The invention relates to an apparatus and a method for identifying erroneous data in at least one memory element, in particular a register, comprising at least one flip-flop. It furthermore relates to an apparatus to carry out a method of this type and an integrated circuit with an apparatus of this type.

BACKGROUND OF THE INVENTION

The special feature of a register is that its data outputs always (and not, such as e.g. in the case of a RAM, only after addressing) show the stored datum and are often not only used for storage, but also define a hardware function, for example the baud rate of a timer, the protocol of a communication, etc.

The term "soft errors" refers to errors that are not caused by physical damage, but through modification of the state of a bistable component due to external influences. Bistable components are, for example, flip-flops which can assume and also maintain two different states.

Soft errors are normally caused by high-energy particles, for example also as part of the cosmic radiation or radioactive inclusions in the housing material which penetrate a semiconductor and strike there, this being referred to as a "Single Event Upset" (SEU). RAM modules, but also flip-flops, are typically affected. Known countermeasures are error-detecting and/or error-correcting codings of the data in the RAM, for example by means of Error Correcting Code (ECC).

In the case of flip-flops, it is known as a protective measure to perform a majority decision. The flip-flop is triplicated and if all flip-flops do not have the same state, a "2 out of 3" or two-thirds majority decision is performed. Furthermore, radiation-resistant flip-flops are known which are less vulnerable but are also significantly larger than standard flip-flops. Other known methods use periodic reading (program-controlled) and rewriting of critical data. Periodic checking with CRC is similarly known, whereby each bit is serially polled periodically by means of e.g. a state machine and is incorporated in the calculation of a CRC sum.

Flip-flops are normally used as basic elements for many types of registers which are used, in particular, in microcontrollers, but also in most other IC types, for storage of data. One application is e.g. the storage of calibration data for an analog circuit or of configuration data for adaptation to a specific task.

In the case of registers which store variable data, the occurrence of the aforementioned errors means a temporary deviation in the calculation flow or control flow which can often be ignored in the system. A modification of the data in a configuration register or trim register is significantly more critical since, in registers of this type, the stored data are normally written once only after the system is switched on. In some instances, an error due to SEU will then remain until the system is switched off and may result in severe malfunctions.

SUMMARY OF THE INVENTION

An aspect of the invention provides a method for detecting and controlling soft errors in a register. Furthermore, a corresponding apparatus and a corresponding integrated circuit are intended to be provided.

In relation to the method, according to an aspect of the invention, when data are written to the at least one data memory element, at least one write security bit is generated from these data and is stored in an assigned security memory element, and wherein at least one output security bit is calculated continuously from the data in the same way as for writing and is compared with the corresponding write security bit.

An aspect of the invention is based on the notion that the detection of soft errors is important, particularly when data are not written regularly but instead, particularly at the start of operation, are stored once only. Although these data are written once only, they may contain important information, for example configuration settings which are important for further operation. Errors in the data should be identified immediately following the occurrence or with a short latency. An implementation of majority decision units in which the data are written to some extent in a redundant manner to a plurality of memory modules requires large chip areas and high power consumption. The methods with periodic checking take up processing time. The more critical the error detection latency requirement, the longer the processing time.

As has now been recognized, a reliable and resource-saving detection of soft errors is possible in that a number of security bits characterizing the data are already generated or calculated during the original writing of the data. These (output) security bits can be regenerated from the output data by means of combinatory logic in the same way, i.e. according to the same calculation rules, whereby a comparison with the writing of these bits reliably indicates the occurrence of soft errors in the absence of a correspondence. The occurrence of errors can therefore be detected immediately. This then enables a warning against the use of these data and/or direct correction of these data.

According to an aspect of the invention, at least one security bit or output security bit is calculated from the data from the data memory element in the same way as with writing and is compared with the corresponding write security bit. An absence of correspondence indicates the interim occurrence of a soft error which expresses itself, for example, in one or more bit inversions.

The writing of the data is advantageously initiated by a processor (CPU) or by a state machine or by a signal.

An absence of correspondence between the respective write security bit and the corresponding read security bit is preferably signaled to the processor.

The signaling is preferably effected by setting at least one flag and/or interrupt. This is advantageously performed e.g. in a status register with or without an interrupt capability, and enables the system or the processor to initiate and carry out error-handling measures.

In one preferred embodiment, due to an absence of correspondence between the calculated security bits or output security bits and the generated write security bit, i.e. on detection of an error that has occurred, the data are thus rewritten to the data memory element. This means that the procedure with which the data were originally written to the memory element is repeated by the processor or state machine. However, in contrast to known methods, this is not performed periodically, but only if required, i.e. if an error has occurred. In this way, the data are then—at least initially—available once more in error-free form for further procedures.

The security bits are preferably parity bits and/or ECC bits. Parity bits characterize whether and how many "1" or "0" states are present in the data bits. In the case of even parity bits, an odd number of "1" states of the data corresponds to the value "1" of the parity bit; a "0" represents an even number of "1" bits of the data. This assignment is selected inversely in the case of odd parity bits.

ECC (Error Correcting Code) bits are understood here to mean bits, or the method of generation thereof, which, at least to a restricted extent, allow not only the detection of errors but also the correction thereof by means of the ECC bits. Normally, 1-bit errors can be corrected immediately and 2-bit errors can be detected but not corrected. Multi-bit errors can be partially detected. The security bits can also be generated and written on the basis of other memory protection methods.

In relation to the apparatus, the aforementioned object is achieved according to the invention with at least one logic unit in which a method described above is carried out. The method is preferably implemented through hardware and/or software in the at least one logic unit. The same logic unit can be provided to generate the security bits for writing and reading the data, or one logic unit can be provided in each case for each of the two procedures. The logic units may also be part of the processor or may be combined with the latter.

In relation to the integrated circuit, the aforementioned object is achieved with at least one data memory element, at least one security memory element and an apparatus of this type. An integrated circuit of this type is preferably implemented in ICs with trimming of the parameters. (The component tolerances are often too great to achieve the required precision of a circuit. In such cases, components are aligned with one another, e.g. in the case of a voltage divider, one of a plurality of tapping points is selected.) A trimming is used in all measuring circuits, e.g. for sensor signals, valve current, but also power supply and comparators. A further possible use is the configuration for adapting the IC to an environment, e.g. vehicle type, wheel sensor type, monitoring thresholds of the on-board voltage, etc.

In one preferred design, the data memory element comprises at least one flip-flop.

The advantages of the invention lie in particular in that, due to the parallel writing of security bits during the writing of the data and a continuous monitoring of the data outputs, a resource-saving facility is created for detecting the occurrence of soft errors. By means of a continuous calculation of the security bits and a comparison with the originally written security bits, a warning against a further use of the erroneous data can be issued by means of a notification to the processor on detection of a discrepancy, as a result of which system malfunctions can be prevented.

BRIEF DESCRIPTION OF THE DRAWINGS

An example embodiment of the invention is explained with reference to a drawing. In the drawing, in a strongly schematic representation.

DETAILED DESCRIPTION OF THE PREFERRED EMBODIMENTS

Identical parts are denoted in all figures with the same reference numbers.

Figure 1:
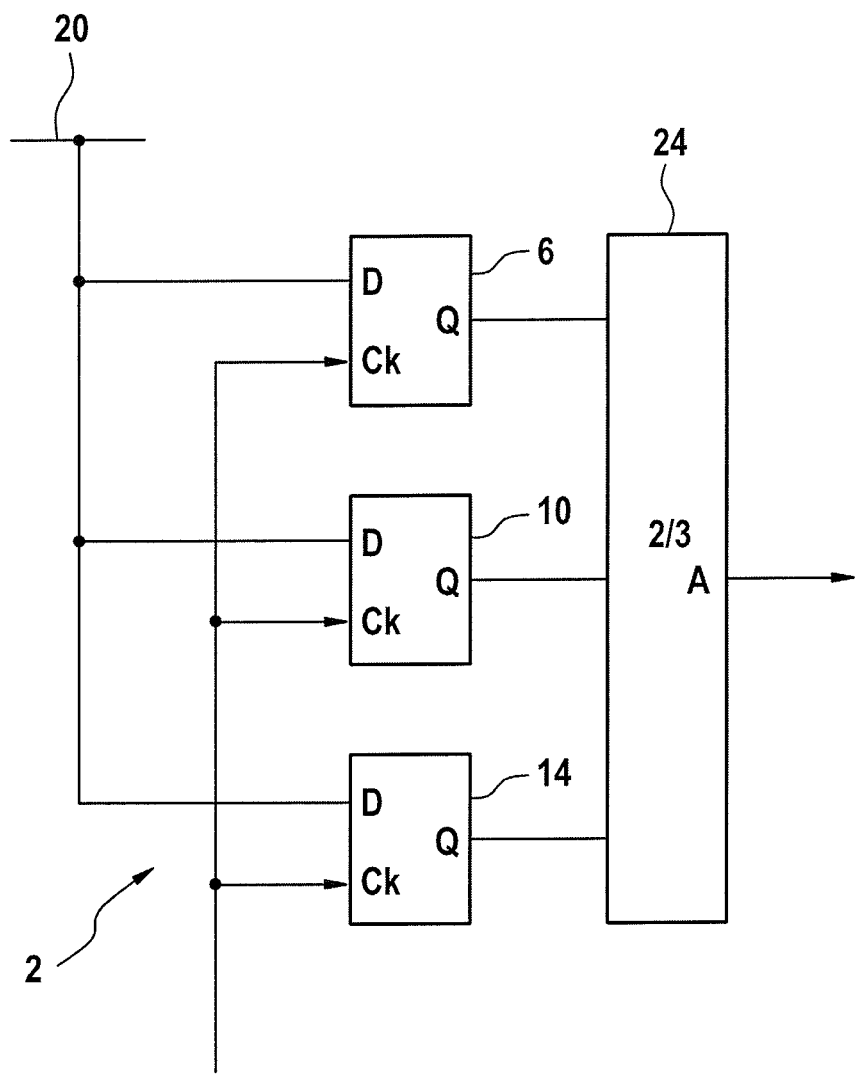
FIG. 1 shows a known configuration of three flip-flops with a majority decision circuit.

FIG. 1 shows a register 2 for one bit. The register 2 is designed as a majority decision unit and comprises three flip-flops 6, 10, 14, which are designed as D-flip-flops. The respective flip-flop 6, 10, 14 in each case comprises a data input D, a clock input Ck ("Clock") and a data output Q. One of two stable states (for example characterized as "0" and "1") is set by a processor (not shown) in each case in the three flip-flops 6, 10, 14 via a data line 20, wherein the same state is set in each case in all three flip-flops 6, 10, 14. The data bit is therefore stored, as it were, with triple redundancy or in triplicate.

A majority decision logic unit 24 outputs the datum or bit stored in the register 2 implemented by the three flip-flops 6, 10, 14 in each case the state or the bit from the flip-flops 6, 10, 14 and makes a value available at an output A. Two cases can be distinguished here. In the case where the state of all three flip-flops 6, 10, 14 is identical, this state is made available at the output A. If two of the flip-flops 6, 10, 14 have a state which differs from the state of the third flip-flop 6, 10, 14, the state which the two flip-flops 6, 10, 14 have is made available at the output A. As a result, a ⅔ majority decision is performed and the single flip-flop 6, 10, 14 with the differing value is, as it were, overruled.

Disadvantageous aspects of the design of a register of this type are the large number of components and the associated space usage and power consumption.

Figure 2:
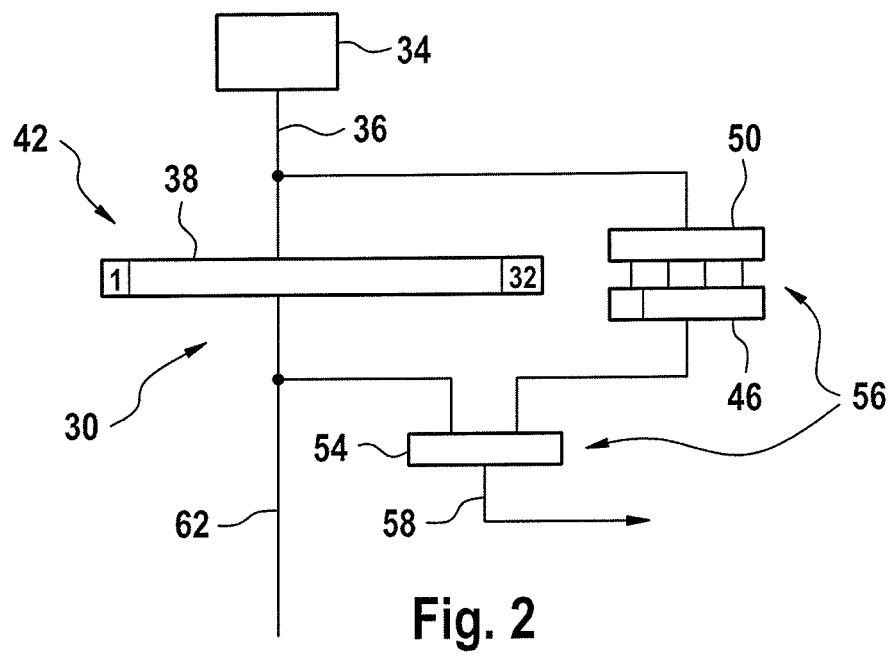
FIG. 2 shows an integrated circuit with an apparatus for detecting erroneous data in at least one memory element, a data memory element and a security memory element in a first preferred embodiment.

FIG. 2 shows an integrated circuit 30 according to an aspect of the invention with a main processor (CPU) or a state machine or the like 34 and a data memory element 38 which is designed as a register 42. The register 42 is designed as a 32-bit register and comprises a multiplicity of flip-flops. In contrast to the circuits discussed in connection with FIG. 1, each bit is now represented by a single flip-flop. The register 42 may alternatively also be designed with a multiplicity of writable and readable memory locations. Furthermore, the integrated circuit 30 comprises a data line 62.

The integrated circuit 30 is enabled to detect soft errors which are caused, for example, by the incidence of high-energy radiation on the corresponding data memory element 38. Due to the ionizing effect of the radiation, a bit inversion, for example, takes place in the register, i.e. the state of a bit is inverted. In contrast to hard errors, soft errors cause no damage to the components, but ensure a modification of their internal state. Depending on which location or number the inverted bit represents, a numerical value represented in the register 2, for example, can change drastically or, with corresponding representation, may even change its sign, which may result in severe malfunctions in systems in which the numerical value characterizes an important or relevant quantity.

In addition to the data memory element 38, the integrated circuit 30 therefore has a security memory element 46 to detect soft errors. If data are written to the data memory element by the main processor 34 or a state machine via a data line 36, security bits are written to the security memory element 46 by a logic unit 50. The security bits may be one or more parity bits or ECC bits.

The data stored in the register 42 are calculated by a logic unit 54 in the same way that the logic unit 50 calculated the security bits, from the data stored in the data memory element 38, and are compared with the security bits stored in the security memory element 46. The logic units 50 and 54 can also be combined into a common logic unit and/or can be combined with the main processor 34/a state machine. An apparatus 56 for detecting soft errors is implemented by them.

In the case where an absence of correspondence is established between the security bits produced or generated during the writing of the data and those calculated from the current register data, the logic unit 54 transmits a signal to the main processor 34 via a data line 58. This signal may comprise the setting of a flag or an interrupt. This enables a response in the integrated circuit 30 to the erroneous data. The data are preferably regenerated or determined once more by the main processor 34 and are rewritten to the register 42 and the error is thus repaired. In a different implementation, the data (e.g. calibration data) can be reloaded from a read-only memory. Alternatively, the main processor 34 can also emit a warning indicating that a reliable operation of the system cannot be guaranteed and/or can instigate emergency measures such as, for example, a system reset, an emergency shutdown or similar.

Figure 3:
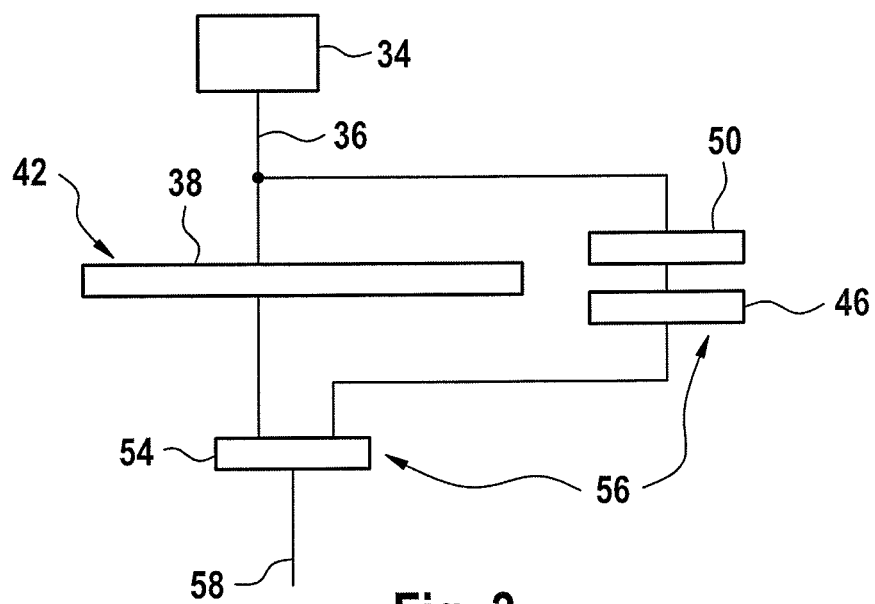
FIG. 3 shows an integrated circuit in a second preferred embodiment.

An integrated circuit 30 in a second preferred embodiment is shown in FIG. 3. Here, the logic unit 50 generates ECC bits, i.e. bits corresponding to an error-correcting algorithm, during the writing of data to the register 42. The ECC bits allow not only the detection but also the correction of errors. In the present example embodiment, this correction is carried out by the logic unit 54, which then makes the corrected data available on the data line 58. This means that a correction of the data is also carried out along with the detection of errors. In this case also, it can be provided that the data are rewritten to the register if an error is detected. In addition, this configuration can also tolerate "hard" errors to some extent.

The integrated circuit 30 according to FIG. 2 or 3 is advantageously used, for example, to protect configuration data in microcontroller peripheral modules, e.g. frequency dividers for clock generators, acquisition values, SPI baud rate, CAN temporal bit clocking, etc.

It can furthermore be used advantageously to protect calibration data in analog ICs. Here, for example, 500 to 1000 bits can be used to trim the parameters. These data are written to a read-only memory during production and are then transferred into flip-flops after the voltage has been switched on or following a reset. Said flip-flops can then be checked continuously for deviations with a few bits. A similar procedure is possible with configuration data in the IC. In contrast to calibration, the configuration is defined in the application. Examples of this are thresholds of comparators, protocols for wheel sensors, etc.

REFERENCE NUMBER LIST

2 Register
6 Flip-flop
10 Flip-flop
14 Flip-flop
20 Data line
24 Majority decision logic
30 Integrated circuit
34 Main processor
36 Data line
38 Data memory element
42 Register
46 Security memory element
50 Logic unit
54 Logic unit
56 Apparatus
58 Data line
62 Data line
D Data input
Ck Clock input
Q Data output
A Output

The invention claimed is:

1. A method for identifying erroneous data, the method comprising:
   generating, by a processor, at least one data bit;
   inputting, by the processor, the at least one data bit into at least one data memory and a first logic unit;
   generating, by the first logic unit, at least one first security bit based on the generated at least one data bit;
   storing, by the processor and the first logic unit, in parallel, the generated at least one data bit into the at least one data memory element and the generated at least one security bit into an assigned security memory element separate from the at least one data memory element;
   generating, by a second logic unit, at least one second security bit based on the at least one data bit read from the at least one data memory element;
   comparing, by the second logic unit, the at least one first security bit read from the assigned security memory element with the at least one second security bit;
   in response to the comparison indicating that at least one first security bit does not correspond with the at least one second security bit, indicating, by the second logic unit, that the stored at least one data bit includes at least one soft error; and
   in response to the second logic unit indicating that the stored at least one data bit includes the at least one soft error:
      regenerating, by the processor, the at least one data bit, or
      outputting, by the processor, a warning signal.

2. The method as claimed in claim 1, wherein the processor is a central processing unit (CPU) or a state machine.

3. The method as claimed in claim 1, wherein the warning signal includes at least one flag and/or interrupt.

4. The method as claimed in claim 1, wherein the at least one first security bit and the at least one second security bit are parity bits and/or ECC bits.

5. The method as claimed in claim 1, wherein the at least one memory element is a register comprising at least one flip-flop.

6. An apparatus for identifying and correcting erroneous data in at least one memory element, comprising at least one logic unit in which a method as claimed in claim 1 is carried out.

7. An integrated circuit with at least one data memory element, at least one security memory element and an apparatus as claimed in claim 6.

8. The integrated circuit as claimed in claim 7, wherein the data memory element comprises at least one flip-flop.

* * * * *